(12) United States Patent
Farley et al.

(10) Patent No.: US 6,870,170 B1
(45) Date of Patent: Mar. 22, 2005

(54) ION IMPLANT DOSE CONTROL

(75) Inventors: Marvin Farley, Ipswich, MA (US); Takao Sakase, Rowley, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/792,394

(22) Filed: Mar. 4, 2004

(51) Int. Cl.$^7$ ............................................. H01J 37/304
(52) U.S. Cl. ............................................. 250/492.21
(58) Field of Search ....................... 250/492.21, 441.11

(56) References Cited

U.S. PATENT DOCUMENTS

| | | |
|---|---|---|
| 4,234,797 A | 11/1980 | Ryding |
| 6,297,510 B1 | 10/2001 | Farley |
| 6,639,231 B1 * | 10/2003 | Simmons et al. ...... 250/492.21 |

OTHER PUBLICATIONS

J. Kraupner et al., "Dose Theory and Pressure Compensation on Axcelis GSD High Current Implanter" in IEEE in the Proceedings of the 14th International Conference in ION Implantation Technology, pp. 260–263.

* cited by examiner

*Primary Examiner*—Kiet T. Nguyen
(74) *Attorney, Agent, or Firm*—Boult Wade Tennant

(57) ABSTRACT

This invention is concerned with the control of implanting ions into a substrate, such as doping semiconductor wafers. The ion beam is measured to ensure waters are implanted with the correct, uniform ion dose. The incident ion beam comprises ions and neutrals, yet detectors measure only ions. The ions/neutrals ratio varies with the ion implanter's chamber pressure that in turn is known to rise and fall when the ion beam is on and off the wafer respectively, according to a characteristic time constant. This invention provides methods of correcting measured ionic currents to account for neutrals using the time constant. Initially an assumed time constant is used that is later improved by measuring the ionic current after a delay sufficient to allow the chamber pressure to recover to its base value. The time constant may also be improved by removing any quadratic variation in already determined true beam current values.

22 Claims, 5 Drawing Sheets

Fig. 4

```
fit measurements of I_t using two
assumed time constants τ_{a_1}, τ_{a_2}           — 110

↓ from above fit, determine y-axis
intercepts to get ln(I_0)_1, ln(I_0)_2            — 112

↓ from measurement of I_0,
calculate ln(I_0)_{true}                          — 114

↓ plot the two assumed time constants
against errors in intercept value                 — 116
[ln(I_0)_{true} − ln(I_0)_1] and [ln(I_0)_{true} − ln(I_0)_2]

↓ determine line-corrected time constant
τ_{lc} from x-axis intercept                      — 118
```

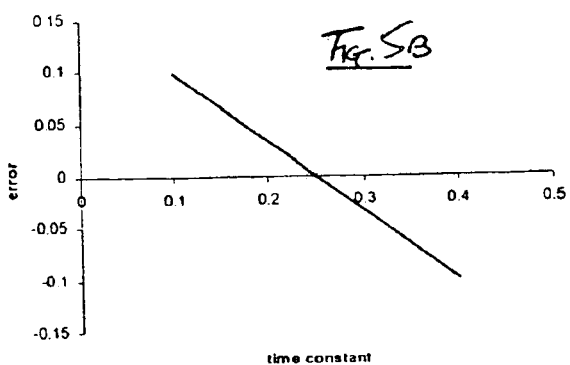

Fig. 5B — Time Constant Determination

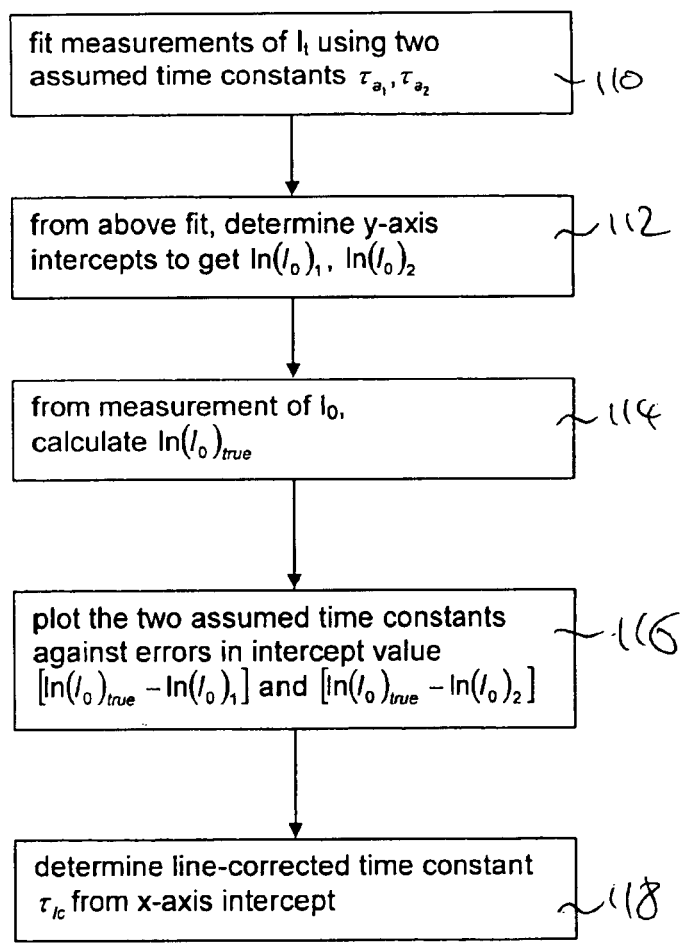

Fig. 5A

FIG. 6 take first 50 samples of $I_t$ measurements (i.e. for scan lines 1, 3, ..., 97, 99) from previous pass and fit using two assumed time constants $\tau_{a_1}, \tau_{a_2}$ to obtain two sets of $\ln(I_0)$ values, $\ln(I_{0_{n=1 to 50}})_1$ and $\ln(I_{0_{n=1 to 50}})_2$, from intercepts  —120 plot $\ln(I_{0_{n=1 to 50}})_{1,2}$ values against scan line number n according to relationship $\ln I_0 = an^2 + bn + c$  —122 fit plots and use magnitude of curvature to determine pass-corrected time constant $\tau_{pc}$  —124

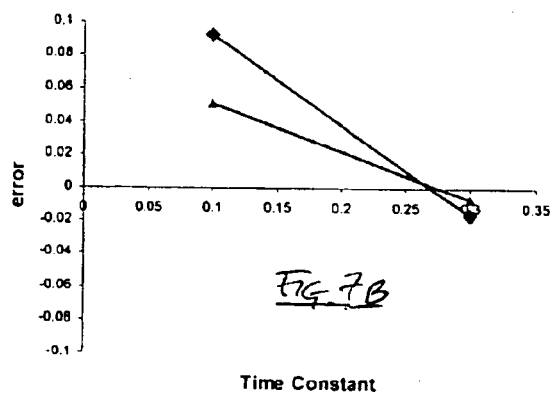

Time constant determination

FIG. 7B

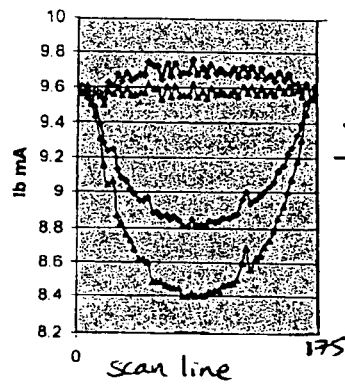

FIG. 7A

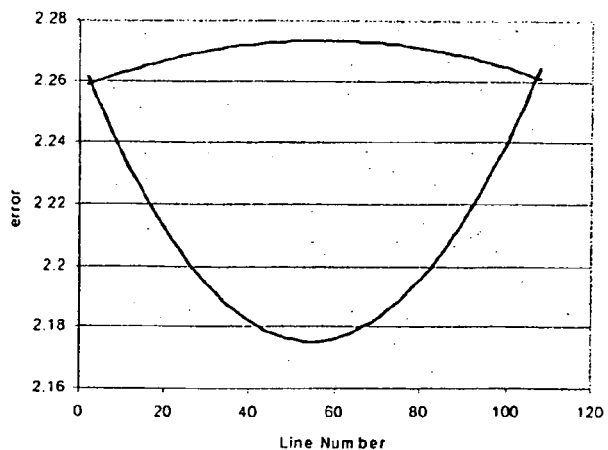

Quadratic curve fit

FIG. 8

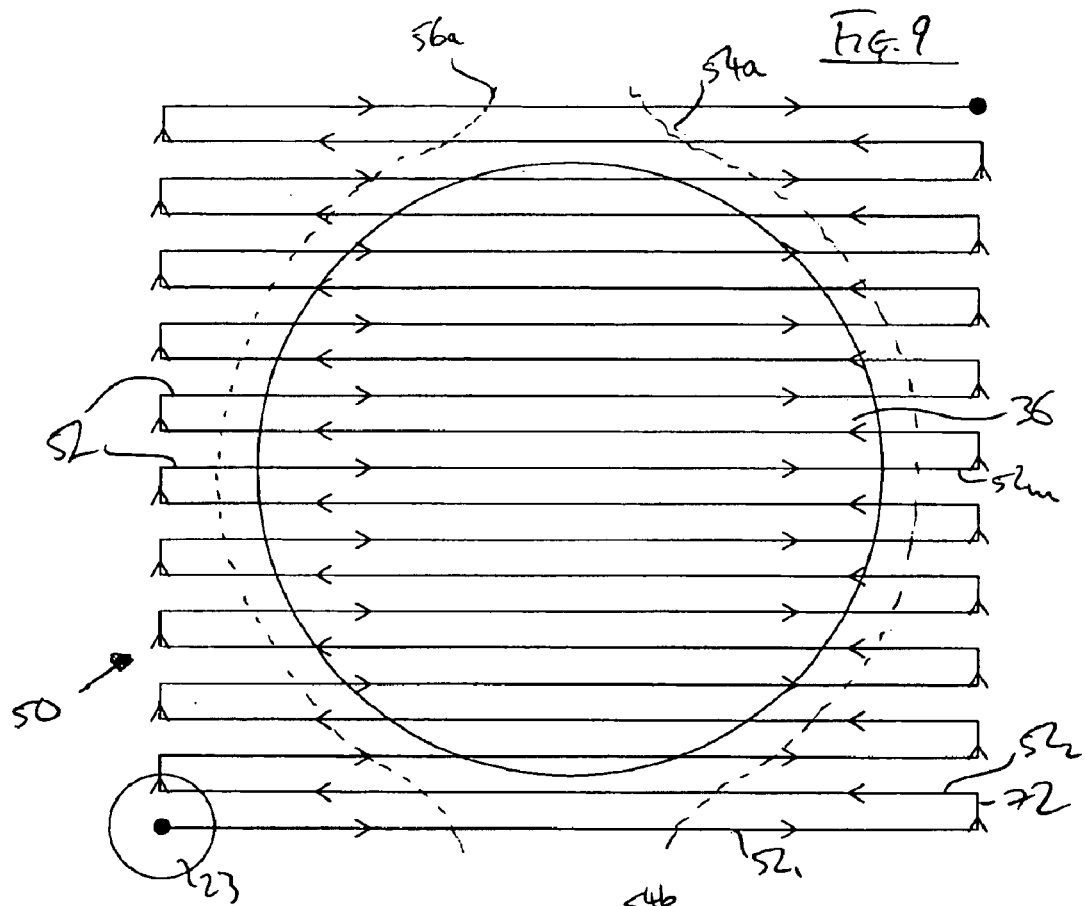
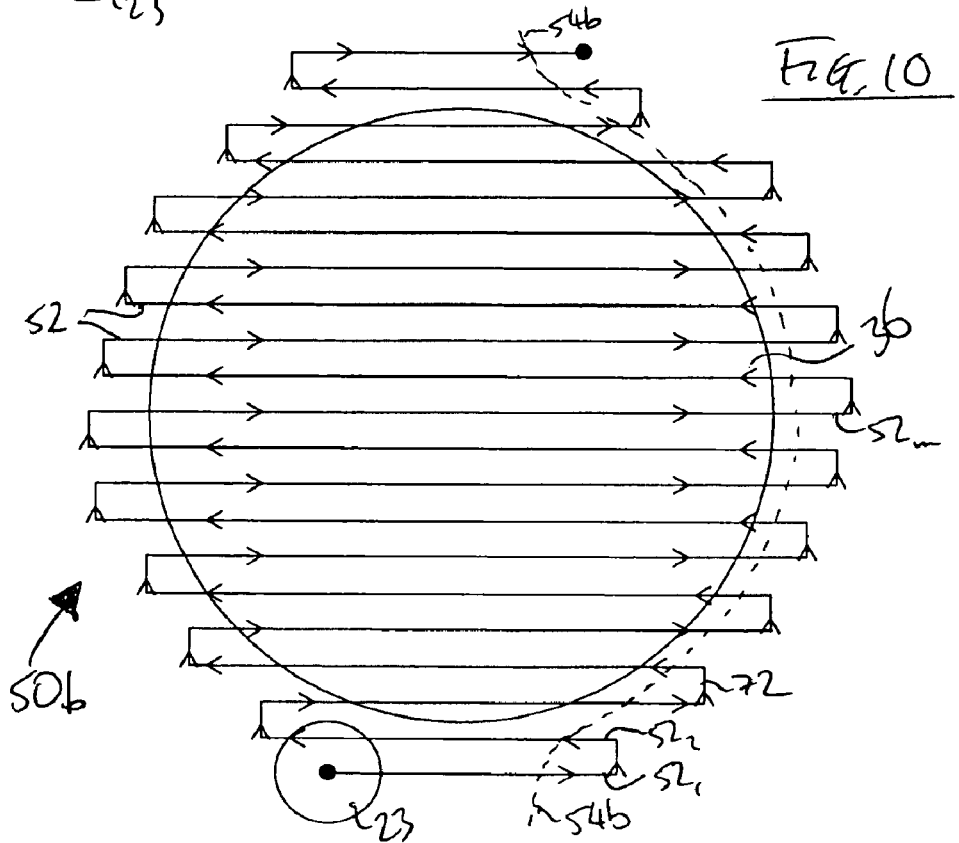

ION IMPLANT DOSE CONTROL

FIELD OF THE INVENTION

This invention is concerned with improvements in or relating to the control of ion dosing a substrate, such as doping semiconductor wafers.

BACKGROUND OF THE INVENTION

Ion implanters are commonly used in the manufacture of semiconductor products for implanting ions into semiconductor substrates to change the conductivity of the material in such substrates or in pre-defined regions thereof. Ion implanters generally comprise an ion source for generating a beam of ions, a mass analyser for selecting a particular species of ions from the ion beam and means to direct the mass-selected ion beam through a vacuum chamber onto a target substrate supported on a substrate holder.

Most frequently, the ion beam cross-sectional area at the target substrate is less that the surface area of the substrate which necessitates scanning of the beam over the substrate using a one or two-dimensional scan so that the beam covers the whole surface of the substrate. Three scanning techniques are commonly employed in ion implantation, as follows: (i) electrostatic and/or magnetic deflection of the ion beam relative to a static substrate; (ii) mechanical scanning of the target substrate in two orthogonal directions relative to a static ion beam; and (iii) a hybrid technique involving magnetic or electrostatic deflection of the ion beam in one direction and mechanical scanning of the target substrate in another generally orthogonal direction.

An important objective in the fabrication of semiconductor wafers is to ensure that for any selective species of ions, the wafers are implanted with the correct ion dose and that the dose is uniform throughout and across the wafer or part of the wafer targeted to receive the implanted ions. At present, the semiconductor industry frequently demands a dose uniformity of 1% or better. Failure to achieve such standards is both time consuming and very costly due to the significantly high cost of the wafers themselves.

The dose delivered during an implant process is monitored by measuring beam current using an ion beam current detector (usually a Faraday cup) positioned 'behind' the wafer so that, as the beam and the wafer effect movement one relative to the other so that the beam is no longer obstructed by the wafer, the beam can fall on the Faraday detector. Where implantation of multiple wafers is concerned, this may be achieved by positioning the Faraday detector behind the movable (usually rotatably) wafer holder with one or more gaps/slits in the holder through which the beam can pass to the Faraday detector that is aligned with the general path of the ion beam. Such an arrangement is disclosed in U.S. Pat. No. 4,234,797. Where single wafer implantation occurs, the Faraday cup will normally be placed in a fixed position behind the wafer so that the beam impinges on the Faraday detector as the wafer is moved out of alignment with the ion beam after each single traverse or sweep of the ion beam across the wafer. Such an arrangement is described in British Patent Application No. GB0400485.9.

Upon transport to the wafer, ions in the ion beam may become neutralised and so lose their electric change. These neutrals will continue to travel in the ion beam with the ions and will also implant in the wafers. Existing beam current detectors can measure only the ionic current, i.e. they cannot detect any neutralised ions, and so will normally understate the true rate of delivery of desired species, including both ions and neutrals, in the ion beam. Beam ions are generally neutralised by collisions with residual gas molecules in the vacuum chamber and it is known that the proportion of ions which become neutralised increases with increasing residual gas pressure. Collisions may also result in the state of charge of beam ions being increased, e.g. from singly to doubly charged or reduced from doubly or singly charged, and both these effects can contribute to beam current measuring errors.

It has been recognised that there is a need to compensate for the understatement or overstatement of the Faraday detector. A true or corrected beam current would be a proper measure of the rate of delivery in the beam of particles (whether ions or neutrals) of the species to be implanted. With accurate monitoring of the true beam current, the implant process can be adjusted to ensure uniform dosing across the entire wafer.

An ion implanter is described in U.S. Pat. No. 6,297,510 that may be operated to determine the true beam current. The ion implanter includes a substrate holder that moves relative to the ion beam such that the ion beam is traced across a wafer along a series of scan lines forming a raster pattern. As the ion beam is scanned relative to the wafer, photoresist layers provided on the wafer outgas to cause a rise in the residual gas pressure within a vacuum chamber enclosing the substrate holder. Transits of the ion beam across the wafer are separated by periods where the ion beam is no longer incident on the wafer and so out gassing stops. The term "separating periods" is used herein to refer to the periods when the ion beam is not incident on the wafer between transits of the ion beam across the wafer. During these separating periods, a vacuum pump that continually pumps on the vacuum chamber can act to cause the pressure to fall towards the vacuum chamber's base pressure once more. This fall in pressure during the separating periods falls exponentially, with time t and can be represented as $P_t$ where $$P_t = P_o e^{-t/\tau} \quad (1)$$

(with $P_o$ being the pressure at t=0), and $\tau$ is a characteristic pump-down time constant for the vacuum chamber.

As noted above, the ionic current measured by the Faraday detector varies with the vacuum chamber pressure. Thus, the variation in the measured ionic current $I_m$ is a function of pressure P and can be expressed as $$I_m = I_0 e^{-KP} \quad (2)$$

where $I_o$ is the true beam current (ions and neutrals) and K is a constant that can be determined for any particular implant recipe. Equations (1) and (2) can be combined to show that the ionic beam current $I_m$ during a separating period is given by $$I_m = I_o e^{-\left(KP_o e^{-\frac{t}{\tau}}\right)} \quad (3)$$

that, taking natural logarithms, can be expressed as $$\ln I_m = \ln I_0 - KP_o e^{-t/\tau} \quad (4)$$

Equation (4) is of the general form y=mx+c. Thus, measuring a set of ionic beam currents $I_m$ at known times during a separating period allows a graph to be plotted of $\ln I_m$ against $e^{-t/\tau}$. The true beam current $I_o$ can then be found from the intercept with the y axis (as $c = \ln I_0$ in this case). It will be appreciated that knowledge of the constant K is not required with this method (and in fact, K can be found from the gradient $m=-KP_0$). However, the time constant $\tau$ must first be determined to allow the graph to be plotted. The time constant $\tau$ is determined by measuring two or more chamber pressures whilst the pressure drops in the vacuum chamber (either initially or during a separating period). Equation (1) can be rewritten as $$\ln P_c = \ln P_o - \frac{t}{\tau} \quad (5)$$

that, like equation (4), is of the form y=mx+c. Fitting the two or more pressure measurements to this form allows the time constant $\tau$ to be determined as the gradient $m=-\tau^{-1}$.

Hence, after an initial determination of the pump-down time constant $\tau$, a series of ionic beam currents may be measured at the end of a scan line during the separation period to determine the true beam current at that time. The true beam current will vary slowly over time, and this drift will be detected and the implantation process may be controlled so as to correct for the variation and ensure uniform dosing across the entire wafer. For example, if the true ion beam current is found to fall with time, the scan speed of the ion beam relative to the wafer may be slowed to achieve the same dosing.

A disadvantage of the method described in U.S. Pat. No. 6,297,510 is that it requires the pressure in the vacuum chamber to be measured in order to determine the pump-down time constant $\tau$. This introduces a requirement for an additional detector capable of measuring the pressure within the vacuum chamber, and this is detrimental in terms of the complexity and expense of the ion implanter.

SUMMARY OF THE INVENTION

It is an object of the present invention to improve on the prior art implanter disclosed in U.S. Pat. No. 6,297,510. It is also an object of the present invention to provide a method of determining the true beam current from the measured ionic beam current without the burden of acquiring pressure measurements.

According to a first aspect, the present invention resides in an ion implanter comprising a vacuum chamber, a substrate holder in the vacuum chamber operative to support a target substrate, and an ion beam generator operative to generate a beam of ions including a species to be implanted in the target substrate, scanning apparatus operative to effect a relative scanning movement between the target substrate and the ion beam and a vacuum pump operative during implantation to pump residual gas from the vacuum chamber.

The scanning apparatus is arranged to produce, during an implant, repeated scans of the beam over the target substrate separated by periods when the beam does not impinge on the target substrate. Residual gas pressure in said chamber rises during each of said scans due to outgassing from the target substrate and falls exponentially with a pump down time constant towards a minimum pressure value during said separating periods due to pumping by said vacuum pump. At least some of said separating periods have an insufficient duration relative to said pump down constant to allow the residual gas pressure to reach said minimum pressure value.

The ion implanter further comprises an ion current detector operative to provide multiple time spaced measurements of the ionic current in the ion beam at the target substrate during each of a plurality of said separating periods including said periods having insufficient duration, and a controller operative to control said scanning apparatus to produce said repeated scans and being operative to provide at least one extended said separating period which has sufficient duration to allow the residual gas pressure to be pumped down to said minimum pressure value. The ion current detector is operative to provide said multiple time spaced measurements during said extended separating period.

The implanter also comprises a processor operative to (a) receive said multiple measurements from each of said separating periods including said extended separating period, (b) to identify from said ionic current measurements during said extended separating period, a maximum measured beam current value corresponding to the residual gas pressure reaching said minimum pressure value, and (c) to calculate from the multiple time spaced measurements received during said extended separating period and said identified maximum measured beam current value, an estimate of said pump down time constant. Using this estimated pump down time constant and said received measurements during each of said plurality of separating periods subsequent to said extended operating period, and said estimate of said pump down time constant, the processor (d) calculates respective corrected values for total beam current representing the rate of delivery in the beam of particles of the species to be implanted.

Such an ion implanter uses one relatively long pause during a separating period to estimate the pump down time constant, and then uses this estimate during relatively short separating periods rapidly to provide an estimate of the true beam current. Hence, this ion implanter may be operated to use an improved estimate of the pump down time constant. Moreover, there is no need for the ion implanter to measure the pressure within the vacuum chamber in order to determine the pump down time constant, in contrast to the prior art described above.

For the avoidance of doubt, the plurality of separating periods need not comprise the entire set of separating periods, i.e. it is perfectly reasonable to use only a subset of all the separating periods for measuring the ionic current and calculating a true beam current therefrom.

Optionally, the processor as defined to the first aspect of the present invention is operative to estimate the pump down time constant using a linear regression.

Preferably, the processor as defined in the preceding paragraph or as defined according to the first aspect of the invention is operative to estimate the pump down time constant using at least two true beam currents determined from the measurements received during the extended separating period and at least two predetermined time constants.

Optionally, the processor, as defined according to the first aspect of the invention or as modified according to either or both the preceding two paragraphs, is operative initially to calculate from said received measurements during each of a first number of said plurality of separating periods prior to said extended separating period and a predetermined estimate value of said pump down time constant, first respective corrected values for total beam current representing the rate of delivery in the beam of particles of the species to be implanted.

This may be beneficial as, where circular wafers are used as the target substrate, initial scans of the beam over the wafer may result in only a fraction of the ion beam clipping the edge of the wafer. Such a small exposure will produce only a slight rise in the pressure in the vacuum chamber and thus only a slight fall in pressure during the ensuing separating period. This will lead to only a small change in ionic beam current during the separating period that will prevent an acceptable determination of the pump down time constant.

Optionally, the ion implanter as defined according to the first aspect of the invention or as modified in any of the ways described above or any combination thereof is operative to perform step (b) during a separating period substantially corresponding to when a rise in the residual gas pressure in the chamber due to outgassing first occurs.

Optionally, the ion implanter as defined according to the first aspect of the invention or as modified in any of the ways described above or any combination thereof may be used for implanting a target substrate comprising a circular wafer having a predetermined diameter, wherein said ion beam generator is operative to generate a beam having orthogonal cross-sectional dimensions which are less than said diameter and the scanning apparatus is operative to scan the beam in multiple spaced lines over the wafer to form a raster, with said separating periods between said scan lines; and wherein said processor is operative at a selected time: to store ionic current measurements received during separating periods at the end of selected said scan lines distributed over the wafer area; to calculate using an estimate of said pump down time constant, a corrected total beam current value from the received measurements following each of said selected scan lines to provide an array of corrected total beam current values against the positions of the respective scan lines across the wafer in the scan line spacing direction; to detect from said array, a predetermined quadrature variation of said calculated, corrected total beam current values with position across the wafer; and to calculate a further improved estimate of said pump down constant which substantially eliminates said quadrature variation when used to calculate said corrected total beam current values of the array. Preferably, the selected time is at the end of a pass.

Optionally, the controller is operative to produce an extended separating period only in a first implant and wherein the processor is operative in successive implants to calculate from said received measurements during each of said plurality of separating periods of said successive implants and said improved estimate of said pump down time constant, a corrected value for total beam current representing the rate of delivery in the beam of particles of the species to be implanted.

From a second aspect, the present invention resides in an ion implanter comprising a vacuum chamber, a substrate holder in the vacuum chamber operative to support a target substrate comprising a circular wafer having a predetermined diameter, an ion beam generator operative to generate a beam of ions including a species to be implanted in the target substrate, a scanning apparatus operative to effect a relative scanning movement between the target substrate and the ion beam, and a vacuum pump operative during implantation to pump residual gas from the vacuum chamber.

The scanning apparatus is arranged to produce, during an implant, repeated scans of the beam over the target substrate separated by periods when the beam does not impinge on the target substrate. The residual gas pressure in said chamber rises during each of said scans due to outgassing from the target substrate and falls exponentially with a pump down time constant towards a minimum pressure value during said separating periods due to pumping by said vacuum pump. At least some of said separating periods have insufficient duration relative to said pump down constant to allow the residual gas pressure to reach said minimum pressure value.

The ion implanter further comprises an ion current detector operative to provide multiple time spaced measurements of the ionic current in the ion beam at the target substrate during each of a plurality of said separating periods including said periods having insufficient duration. The ion implanter also comprises a processor operative to receive said multiple measurements, to generate an estimate of said pump down time constant, and to calculate from said received measurements during each of said plurality of separating periods and said estimate of said pump down time constant, a corrected value for total beam current representing the rate of delivery in the beam of particles of the species to be implanted.

The ion beam generator is operative to generate a beam having orthogonal cross-sectional dimensions which are less than said diameter and the scanning apparatus is operative to scan the beam in multiple spaced lines over the wafer to form a raster, with said separating periods between said scan lines.

The processor is operative: (a) to store ionic current measurements received during separating periods at the end of selected said scan lines distributed over the wafer area; (b) to calculate using an estimate of said pump down time constant, a corrected total beam current value from the received measurements following each of said selected scan lines to provide an array of corrected total beam current values against the positions of the respective scan lines across the wafer in the scan line spacing direction; (c) to detect from said array, a predetermined quadrature variation of said calculated, corrected total beam current values with position across the wafer; and (d) to calculate a further improved estimate of said pump down constant which substantially eliminates said quadrature variation when used to calculate said corrected total beam current values of the array.

Such an ion implanter makes use of the effect that any errors in estimating the pump down time constant have a progressively increasing effect on the true beam current as the width of the circular wafer increases. The true beam current drifts only slowly and so can be assumed to remain fairly constant over a reasonable number of scan lines. Thus, the error caused by an inaccurate estimate of the pump down time constant manifests itself as a quadrature variation in the true beam currents calculated for scan lines spread across the wafer.

Optionally, the processor as defined according to the second aspect of the invention is operative to eliminate the quadrature variation by optimising the pump down time constant iteratively. Preferably, the processor is operative to determine the curvature of the quadrature variation and is operative to use the curvature to calculate the improved time constant. This latter arrangement is currently preferred as it allows the improved time constant to be determined in one pass, rather than the iterative arrangement that requires multiple passes.

According to a third aspect, the present invention also provides a method of implanting ions in a target substrate using an ion implanter comprising a vacuum chamber, a substrate holder in the vacuum chamber operative to support the target substrate, an ion beam generator, a scanning apparatus, a vacuum pump, an ion current detector, a controller and a processor; the method comprising the steps of: generating a beam of ions with the ion beam generator including a species to be implanted in the target substrate; operating the controller to control said scanning apparatus to effect a relative scanning movement between the target substrate and the ion beam; and pumping the vacuum chamber with the vacuum pump during implantation to pump residual gas from the vacuum chamber.

The scanning apparatus is operated to produce during an implant repeated scans of the beam over the target substrate separated by periods when the beam does not impinge on the target substrate, whereby residual gas pressure in said chamber rises during each of said scans due to outgassing from the target substrate and falls exponentially with a pump down time constant towards a minimum pressure value during said separating periods due to pumping by said vacuum pump, at least some of said separating periods having insufficient duration relative to said pump down constant to allow the residual gas pressure to reach said minimum pressure value.

The method further comprises measuring the ionic current with the ion current detector to provide multiple time spaced measurements of the ionic current in the ion beam at the target substrate during each of a plurality of said separating periods including said periods having insufficient duration; operating the controller to control said scanning apparatus to provide at least one extended said separating period which has sufficient duration to allow the residual gas pressure to be pumped down to said minimum pressure value, and operating said ion current detector to provide said multiple time spaced measurements during said extended separating period; passing said multiple measurements from each of said separating periods including said extended separating period to the processor, identifying from said ionic current measurements during said extended separating period, using the processor, a maximum measured beam current value corresponding to the residual gas pressure reaching said minimum pressure value, calculating from the multiple time spaced measurements received during said extended separating period and said identified maximum measured beam current value, using the processor, an estimate of said pump down time constant, and calculating from said received measurements during each of said plurality of separating periods and said estimate of said pump down time constant, using the processor, a corrected value for the total beam current representing the rate of delivery in the beam of particles of the species to be implanted.

Optionally, the processor estimates the pump down time constant using a linear regression. Preferably, the processor estimates the pump down time constant using at least two true beam currents determined from the measurements received during the extended separating period and at least two predetermined time constants.

The method according to the third aspect of the present invention or as modified according to the preceding paragraph may optionally be performed such that the processor is operated: (a) initially to calculate from said received measurements during each of said plurality of separating periods and a predetermined estimate of said pump down time constant, a corrected value for total beam current representing the rate of delivery in the beam of particles of the species to be implanted; (b) subsequently to identify from said ionic current measurements during said extended separating period, a maximum measured beam current value corresponding to the residual gas pressure reaching said minimum pressure value, to calculate from the multiple time spaced measurements received during said extended separating period and said identified maximum measured beam current value, an estimate of said pump down time constant; and(c) thereafter to calculate from said received measurements during each of said plurality of separating periods and said estimated pump down time constant, a corrected value for total beam current representing the rate of delivery in the beam of particles of the species to be implanted.

Preferably, the processor performs step (b) during a separating period substantially corresponding to when a rise in the residual gas pressure in the chamber due to outgassing first occurs.

Optionally, the method according to the third aspect of the invention or as modified by any of the above paragraphs may comprise implanting a target substrate comprising a circular wafer having a predetermined diameter; wherein said ion beam generator generates a beam having orthogonal cross-sectional dimensions which are less than said diameter and the scanning apparatus is operative to scan the beam in multiple spaced lines over the wafer to form a raster, with said separating periods between said scan lines; and wherein said processor is operated at a selected time: to store ionic current measurements received during separating periods at the end of selected said-scan lines distributed over the wafer area; to calculate using an estimate of said pump down time constant, a corrected total beam current value from the received measurements following each of said selected scan lines to provide an array of corrected total beam current values against the positions of the respective scan lines across the wafer in the scan line spacing direction; to detect from said array, a predetermined quadrature variation of said calculated, corrected total beam current values with position across the wafer; and to calculate a further improved estimate of said pump down constant which substantially eliminates said quadrature variation when used to calculate said corrected total beam current values of the array.

Preferably, the selected time is at the end of a pass. Optionally, the controller produces an extended separating period only in a first implant and wherein the processor is operated in successive implants to calculate from said received measurements during each of said plurality of separating periods of said successive implants and said improved estimate of said pump down time constant, a corrected value for total beam current representing the rate of delivery in the beam of particles of the species to be implanted.

According to a fourth aspect, the present invention resides in a method of implanting ions in a target substrate using an ion implanter comprising a vacuum chamber, a substrate holder in the vacuum chamber operative to support a target substrate comprising a circular wafer having a predetermined diameter; an ion beam generator, a scanning apparatus, a vacuum pump, an ion current detector, and a processor; the method comprising the steps of: generating an ion beam using the ion beam generator including a species to be implanted in the target substrate; pumping the vacuum chamber with the vacuum pump during implantation to pump residual gas from the vacuum chamber; operating the scanning apparatus to effect a relative scanning movement between the target substrate and the ion beam to produce, during an implant, repeated scans of the beam over the target substrate separated by periods when the beam does not impinge on the target substrate; whereby residual gas pressure in said chamber rises during each of said scans due to outgassing from the target substrate and falls exponentially with a pump down time constant towards a minimum pressure value during said separating periods due to pumping by said vacuum pump, at least some of said separating periods having insufficient duration relative to said pump down constant to allow the residual gas pressure to reach said minimum pressure value.

The method further comprises measuring an ionic current using the ion current detector to provide multiple time spaced measurements of the ionic current in the ion beam at the target substrate during each of a plurality of said separating periods including said periods having insufficient duration; passing said multiple measurements to the processor, generating an estimate of said pump down time constant using the processor, and calculating from said received measurements during each of said plurality of separating periods and said estimate of said pump down time constant, using the processor, a corrected value for total beam current representing the rate of delivery in the beam of particles of the species to be implanted.

Said ion beam generator is operated to generate a beam having orthogonal cross-sectional dimensions which are less than said diameter and the scanning apparatus is operative to scan the beam in multiple spaced lines over the wafer to form a raster, with said separating periods between said scan lines; and wherein said processor is operated: to store ionic current measurements received during separating periods at the end of selected said scan lines distributed over the wafer area; to calculate using an estimate of said pump down time constant, a corrected total beam current value from the received measurements following each of said selected scan lines to provide an array of corrected total beam current values against the positions of the respective scan lines across the wafer in the scan line spacing direction; to detect from said array, a predetermined quadrature variation of said calculated, corrected total beam current values with position across the wafer; and to calculate an improved estimate of said pump down constant which substantially eliminates said quadrature variation when used to calculate said corrected total beam current values of the array.

Optionally, the processor eliminates the quadrature variation by optimising the pump down time constant iteratively.

Preferably, the method according to the fourth aspect of the invention or as modified by the preceding paragraph is performed wherein the processor determines the curvature of the quadrature variation and uses the curvature to calculate the improved time constant.

BRIEF DESCRIPTION OF THE DRAWINGS

An example of a method and apparatus in accordance with the present invention will now be described with reference to the accompanying drawings, in which:

FIG. 4 is a block diagram showing steps performed to determine a line corrected time constant;

FIGS. 5a and 5b show two graphs obtained following the steps shown in FIG. 4;

FIG. 6 is a block diagram showing steps performed to determine a pass corrected time constant;

FIGS. 7a and 7b show two graphs obtained following the steps shown in FIG. 6;

FIG. 8 shows a further graph following the steps shown in FIG. 6;

FIG. 9 is a representation of a raster scan of an ion beam relative to a substrate showing an alternative position for measuring the ionic beam current; and FIG. 10 is a representation of an alternative raster scan of an ion beam relative to a substrate.

DESCRIPTION OF THE PREFERRED EMBODIMENT

The present invention can readily be illustrated with reference to such a single wafer implant machine, such as the ion implanter 20 shown in FIG. 1. However, it should be understood that the invention may also be embodied in batch implanters of the type in which a batch of wafers mounted on a spinning wheel is processed simultaneously.

Figure 1:
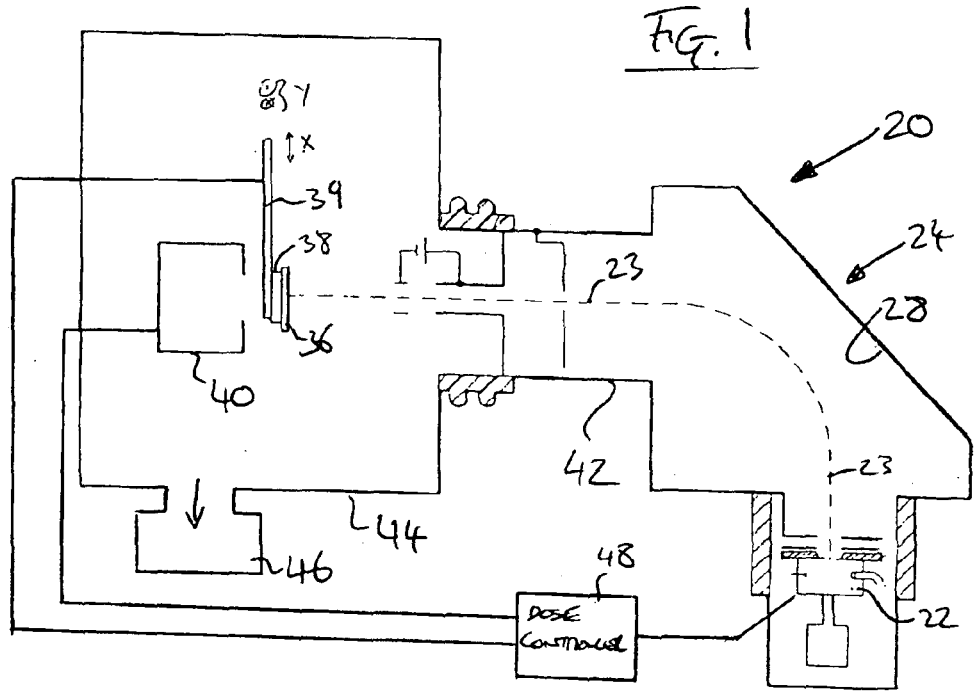
FIG. 1 is a plan view of an ion implanter for use with the present invention.

The single wafer machine of FIG. 1 comprises an ion source 22, such as a Freeman or Bernas ion source, that is supplied with a pre-cursor gas for producing an ion beam 23 to be implanted into a wafer 36. The ions generated in the ion source 22 are extracted by an extraction electrode assembly into a flight tube 24 that includes a mass-analysis arrangement 28 comprising a mass-analysing magnet and a mass-resolving slit, as is well known in the art. Upon entering the mass-analysis arrangement 28 within the flight tube 24, the electrically charged ions are deflected by the magnetic field of the mass-analysis magnet. The radius and curvature of each ion's flight path is defined, through a constant magnetic field, by the mass/charge ratio of the individual ions.

The mass-resolving slit ensures that only ions having a chosen mass/charge ratio emerge from the mass analysis arrangement 28. Ions passing through the mass-resolving slit exit as an ion beam 23 and strike a semiconductor wafer 36 mounted in a process chamber 44 upon a wafer holder 38 that is in turn attached to a scanning arm 39.

A beamstop 40 is located behind (i.e. downstream of) the wafer holder 38 to intercept the ion beam 23 when not incident upon the wafer 36 or wafer holder 38. The beamstop, 40 comprises a Faraday detector 40 for measuring ionic current.

The wafer holder 38 is a serial processing wafer holder 38 and so holds a single wafer 36 at a time. The scanning arm 39 is operable to move the wafer 36 along X and Y axes, the direction of the ion beam 23 defining the Z axis of a Cartesian coordinate system. As can be seen from FIG. 1, the X axis extends parallel to the plane of the paper, whereas the Y axis extends into and out from the plane of the paper.

Figure 2:
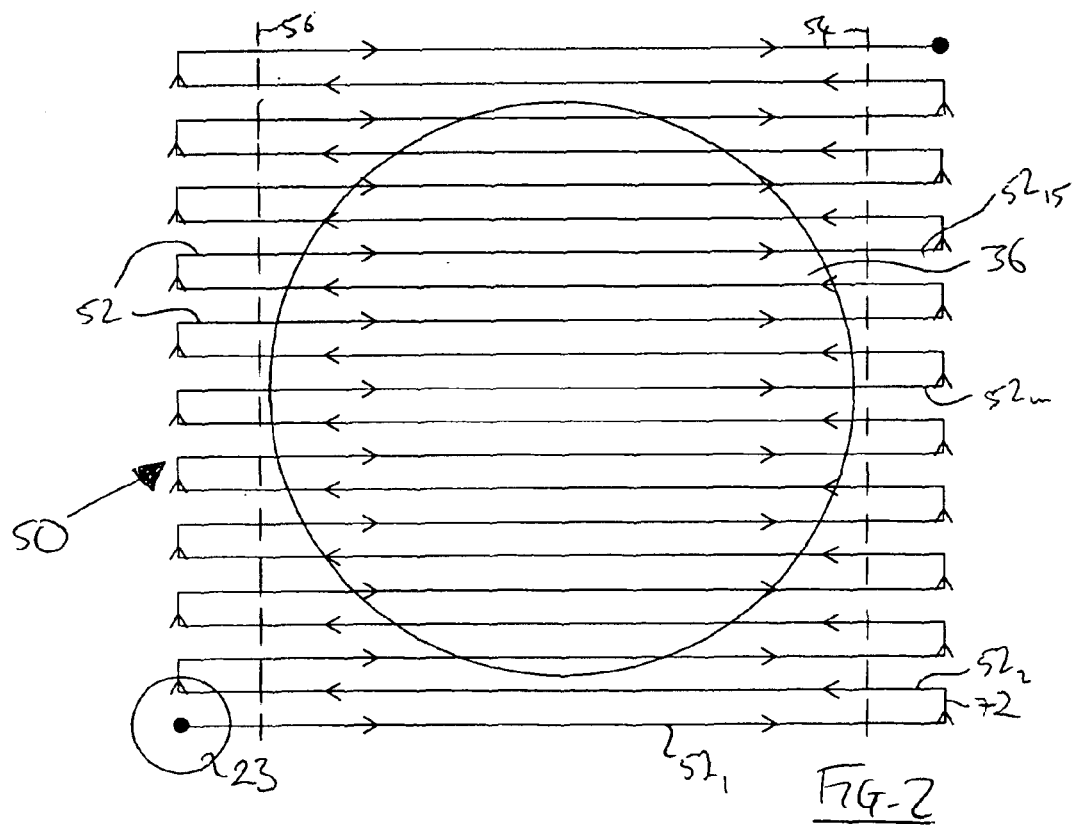
FIG. 2 is a representation of a raster scan of an ion beam relative to a substrate.

Movement of the scanning arm 39 is controlled such that the fixed ion beam 23 scans across the wafer 36 according to the raster pattern 50 shown in FIG. 2. Although the wafer 36 is scanned relative to a fixed ion beam 23, the raster pattern 50 of FIG. 2 is equivalent to the ion beam 23 being scanned over a stationary wafer 36 (and this method is in fact used in some ion implanters). As imagining a scanning ion beam 23 is more intuitive, the following description will follow this convention although in fact the ion beam 23 is stationary and it is the wafer 36 that is scanned.

The ion beam 23 is scanned over the wafer 36 to form a raster pattern 50 of parallel, spaced scan lines $52_1$, to $52_n$, where n is the number of scan lines. Each movement along a scan line $52_n$ will be referred to herein as a 'scan', whilst each complete raster scan 50 will be referred to herein as a 'pass'. Each wafer implant process is likely to comprise many individual 'passes'.

The ion beam 23 has a typical diameter of 50 mm, whereas the wafer 36 has a diameter of 300 mm (200 mm also being common for semiconductor wafers). In this example, a pitch of 2 mm in the Y-axis direction is chosen, leading to a total of 175 scan lines (i.e. n=175) to ensure the full extent of the ion beam 23 is scanned over the full extent of the wafer 36. Only 21 scan lines are shown in FIG. 2 for the sake of clarity.

The raster pattern 50 is formed by scanning the ion beam 23 forwards along the X-axis direction to form the first scan line $52_1$ until the ion beam is completely clear of the wafer 36, by moving the ion beam 23 up along the Y-axis direction as shown at 72, by scanning the ion beam 23 backwards along the X-axis direction until completely clear of the wafer 36 once more to form scan line $52_2$, by moving the ion beam 23 up along the Y-axis direction, and so on until the whole wafer 36 has seen the ion beam 23. As can be seen, each scan line $52_n$ is of a common length, the length being sufficient such that the ion beam 23 is completely clear of the wafer 36 at the start and end of the middle scan line $52_{n/2}$ that corresponds to the fullest width of the wafer 36. Using scan lines $52_n$ of a common length is not essential, as will be discussed later.

The Faraday detector 40 is located downstream of the ion beam 23 such that the ionic current of the ion beam 23 is measured each time the wafer 36 and scanning arm 39 move clear of the ion beam 23. The arrival rate of the charge captured by the Faraday detector 40 as the ion beam 23 scans thereover is a value representing the ionic current in the ion beam 23 at that time. It will be understood that the Faraday detector 40 can respond only to charged particles in the ion beam 23 and does not respond to any neutral particles of the desired species that may have been neutralised before reaching the Faraday detector 40.

As is well known, ion generation in the ion source 22, transport of the ion beam 23 through the mass analysis arrangement 28 to the process chamber 44, and implantation itself must all take place in a high vacuum and the required vacuum chamber 42 is illustrated in FIG. 1. At least the process chamber 44 containing the wafer 36, wafer holder 38 and scanning arm 39 is directly evacuated by a vacuum pump 46. Other parts of the ion implanter 20 may be directly evacuated by further vacuum pumps which are not shown in FIG. 1. In any case, the present invention depends on the appreciation that, in the absence of any residual gas generating sources within the process chamber 44, continuous operation of the vacuum pump 46 causes the residual gas pressure within the processing chamber 44 to recover in accordance with a predictable curve having a definable pump down time constant $\tau$.

As can be seen in FIG. 1, the Faraday detector 40 is connected to a dose controller 48. The dose controller 48 uses values of the ionic beam current supplied by the Faraday detector 40 to estimate a corrected value for the true beam current taking account of any neutralisation or charge stripping of beam ions that may have taken place in the ion beam 23 before reaching the position of the Faraday detector 40 and wafer 36.

The error in the beam current measured by the Faraday detector 40 is dependent on the number of beam ions that are neutralised before they reach the wafer 36. This, in turn, is known to be dependent on the residual gas pressure in the process chamber 44 through which the beam 23 is travelling. During an implant, the wafer 36 being implanted will normally be partially coated with a resist so as to define those areas of the wafer surface in which ions are to be implanted. Ions impinging on resist-coated surfaces are not implanted in the semiconductor wafer 30, but do have the effect of causing outgassing from the resist that contributes to the residual gas pressure in the process chamber 44.

It can be considered that processing of the wafer 36 proceeds with repeated scans, corresponding to the mechanical scan in the X-axis direction, separated by separating periods when the ion beam 23 does not impinge on the wafer 36 (that is when the wafer 36 and scanning arm 39 are being turned around at the end of a scan line $52_n$). During these separating periods, the ionic beam current can be measured by the Faraday detector 40.

No matter which scan line $52_n$ is being formed on the wafer 36, the measurements of the ionic beam current in this embodiment are taken at the same extremity of the ion beam path, i.e. that corresponding to the outer right hand edge beyond line 54 of FIG. 2. Corresponding measurements taken from the left hand edge, i.e. beyond line 56, cannot always be used as the scanning arm 39 blocks the ion beam 23 for scan lines $52_n$ at the centre of the wafer 36. Accordingly, ionic beam current measurements are made only at the end of each odd-numbered scan line, i.e. $52_1, 52_3, 52_5, \ldots$ In this particular embodiment, it takes 150 ms for the support arm 39 to reverse the direction of travel of the wafer 36 for the region beyond line 54. The first 50 ms of this time are set aside as a delay and 100 data points are taken at 1 ms intervals for the remaining 100 ms of the separating period. Accordingly, at the end of each odd numbered scan line $52_1$, $52_3, \ldots$, one hundred measurements of the ionic beam current are taken. As has been described above, the separating periods coincide with when outgassing has stopped from the photoresist on the wafer 36 and the vacuum pump 46 is reducing the pressure in the process chamber 44 according to the characteristic time constant $\tau$. As the pressure drops, neutralisation of ions in the ion beam 23 lessens and so the ionic current measured by the Faraday detector 40 increases across the hundred data points. As will be described in further detail below, these measurements of the ionic beam current are used to obtain the true beam current that includes both ions and neutrals. The dose controller 48 uses the true beam current to adjust the scan speed for the next scan line to compensate for any drift in the true beam current from the previous value. In this way, uniform dosing can be achieved.

Figure 3:
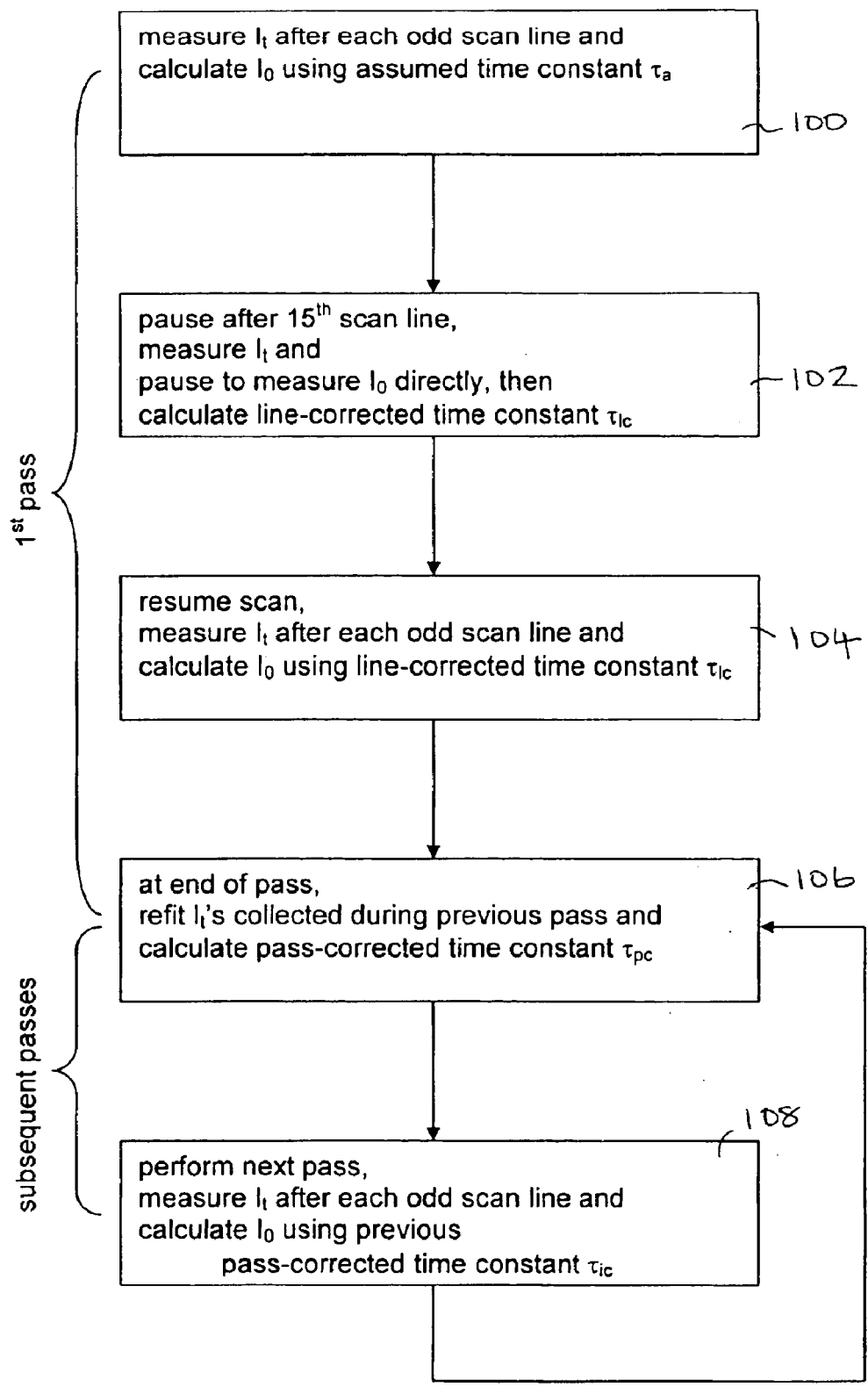
FIG. 3 is a block diagram showing steps performed of an implanter.

FIG. 3 shows, in simplified form, a method of implanting a wafer according to a first embodiment of the present invention. The method is described with reference to a complete implanting process for a wafer 36 that is performed over a series of consecutive passes, each pass comprising 175 scan lines as described previously. At 100, the ion beam 23 scans along scan line $52_1$ to clip the lower edge of the wafer 36 and the ionic beam current is measured once line 54 is crossed at the end of this scan line $52_1$. This is repeated after each of the first seven add scan lines $52_1$ to $52_{13}$. After each odd scan line $52_1$ to $52_{13}$, the dose controller 48 uses the hundred data points collected for the ionic current and uses an assumed time constant $\tau_a$ to fit the data points according to equation (4), $$\ln I_m = \ln I_0 - KP_0 e^{-t/\tau_a}$$

that is in the form y=mx+c.

The dose controller 48 then determines the intercept $c = \ln I_0$ and calculates the true beam current $I_0$. This process all occurs within the separating period at the end of the scan line $52_n$ such that the dose controller 48 can adjust the speed of movement of the scanning arm 39 for the next scan line $52_{n+1}$ according to any drift in the found true beam current $I_0$.

An additional procedure is adopted for the fifteenth scan line $52_{15}$, as is indicated at 102 of FIG. 3. During the separating period after the fifteenth scan line $52_{15}$, one hundred measurements of the ionic beam currents are taken as has been described above. However, the dose controller 48 stops the scanning arm 39 to create a pause whilst the Faraday detector 40 continues to measure the ionic beam current. The dose controller 48 continues to take measurements from the Faraday detector 40 until the ionic beam current settles to a steady value (within the limits of experimental noise). Such a measurement corresponds to when the vacuum pump 46 has pumped the process chamber 44 back down to its base pressure. The ionic beam current measured at this base pressure has been found to be very close to the true beam current $I_0$. In fact, the difference is within the experimental error and so the measured current is taken to be the true beam current $I_0$.

Performing this procedure after the fifteenth scan line $52_{15}$ is an arbitrary choice. Clearly, it is advantageous to perform this improvement as quickly as possible. However, there is a conflicting requirement in that enough of the ion beam 23 must be incident on the wafer 36 long enough to cause an appreciable rise in the chamber pressure. Measuring the true beam current $I_0$ directly in this way allows a line-corrected time constant $\tau_{1c}$ to be calculated and then to be used when determining the true beam current for the subsequent scan lines $52_{17}$ to $52_{175}$. Exactly how this line-corrected time constant $\tau_{1c}$ is determined will be described below with reference to FIG. 4.

With the line-corrected time constant $\tau_{1c}$ determined, the dose controller 48 restarts the scanning arm 39 at 104 such that the ion beam 23 scans across the wafer 36 along the sixteenth scan line $52_{16}$. Implanting continues according to the raster pattern 50 and, as described for 100 above, one hundred measurements of the ionic beam current are taken at the end of each odd scan line $52_{17}$, $52_{19}$, . . . . The true beam current is calculated at the end of each odd scan line $52_1$, $52_3$, . . . as already previously described in step 100, but this time using the line-corrected time constant $\tau_{1c}$ determined at step 102 during the line fitting, rather than the assumed time constant $\tau_a$.

Accordingly, a better estimate of the true beam current is obtained for the seventeenth and subsequent scan lines.

Eventually, all 175 scan lines $52_1$ to $52_{175}$ will be formed to complete the first pass at 106 of FIG. 3. At the end of the first pass, the hundred data points collected at the end of each of the odd scan lines $52_1$, $52_3$, . . . are fitted once more to determine a set of true beam currents for the odd-numbered scan lines $52_1$, $52_3$, . . . . If the time constants used during this fit are correct, plotting the true beam current calculated for each scan line will produce a relatively flat line whose only variation is due to experimental noise. However, if the time constant is incorrect, the plotted true beam currents will show a curved quadratic variation.

This is because the effect of any inaccuracy in the time constant $\tau$ is felt most in the centre of the wafer 36 and so the largest error is seen for this part of the wafer 36. The reason for this curvature lies in the geometry of the implant process and the timing of the ionic current measurement. Firstly, the magnitude of the pressure rise is greatest for the middle of the wafer 36 where the ion beam 23 is incident on the wafer surface for the longest period. Secondly, there is less time for the vacuum to recover after the ion beam 23 moves off of the middle of the wafer 36 before reaching the line 54 where the ionic current measurements begin.

The dose controller 48 plots the true beam current $I_0$ against scan line number n and analyses the results to determine a pass-corrected time constant $\tau_{pc}$ that removes this quadratic variation. This pass-corrected time constant $\tau_{pc}$ may then be used to calculate true beam currents during subsequent implants as follows.

At 108 of FIG. 3, the next implant is performed with the ionic beam current being measured after each odd scan line $52_1$, $52_3$, . . . . As above, the dose controller 48 is used to determine the true beam current after each odd scan line $52_1$, $52_3$, . . . , this time using the pass-corrected time constant $\tau_{pc}$ determined at the end of the first pass. This procedure is repeated for each odd-numbered scan line $52_1$, $52_3$, . . . across the entire pass (i.e. there is no pause after the fifteenth scan line for a direct measurement of the true beam current $I_0$ akin to that described with reference to 102).

At the end of the second pass, the dose controller 48 repeats step 106, i.e. refits the data collected for the ionic beam current and solves to produce a new pass-corrected time constant $\tau_{pc}$ to remove any quadratic variation. This new pass-corrected time constant is used for the subsequent pass and so on until the required number of passes have been performed.

Accordingly, an accurate estimate of the time constant $\tau$ is found and is used such that the dose controller 48 can compensate accurately the scanning speed of the scanning arm 49 to ensure the wafer 36 is dosed with a high uniformity.

FIG. 4 shows the steps 110 to 118 that make up step 102 of FIG. 3. Specifically, at 110 the one hundred measurements of the ionic beam current taken at the end of the fifteenth scan line $52_{15}$ are fitted according to equation (4)

$$\ln I_m = \ln I_0 - KP_o e^{-t/\tau_{m,a}}$$

that is of the form y=mx+c using two assumed time constants $\tau_{a_1}$ and $\tau_{a_2}$. The dose controller 48 plots this relationship and obtains the two intercept values at 112, as shown in FIG. 5a that correspond to c=ln $I_{0_1}$ and c ln $I_{0_2}$. The dose controller 48 then waits for the reading from the Faraday detector 40 to settle, takes an average of this final ionic beam current and uses this average as the true beam current $I_0$. The dose controller 48 can then calculate the natural log of $I_0$, $\ln I_0$. At 116, the dose controller 48 calculates the errors in ln $I_{0_1}$ and ln $I_{0_2}$ determined using the assumed time constants $\tau_{a_1}$, $\tau_{a_2}$ at 112 as $\ln I_{0_1} - \ln I_0$ and $\ln I_{0_2} - \ln I_0$, and plots these errors against the time constants values $\tau_{a_1}$, $\tau_{a_2}$ as shown in FIG. 5b. The dose controller 48 may join the two points using a straight line and calculate the intercept of this straight line with the x axis as this value corresponds to the line-corrected time constant $\tau_{1c}$ as indicated at 118.

FIG. 6 shows the steps 120 to 124 that make up step 106 of FIG. 3. As indicated at 120, the dose controller 48 takes the first fifty samples of the ionic beam measurements (i.e. the hundred data points corresponding to the ionic beam current measured for scan lines $52_1$ to $52_{99}$ from the previous implant) and plots each of these according to equation (1) using two assumed time constants $\tau_{a_1}$, $\tau_{a_2}$ (not necessarily the same as those used in step 102) to determine fifty values of the true beam current $(I_{0_{n-1to50}})_1$, $(I_{0_{n-1to50}})_2$ for each of these scan lines $52_1$ to $52_{99}$.

At 122, the dose controller 48 plots the natural log of these true beam current values $(I_{0_{n-1to50}})_1$, $(I_{0_{n-1to50}})_2$ against the scan line number n, as shown in FIG. 7a (in fact, FIG. 7a shows the values for n=1 to 175). The points may be fitted with curves, like those shown in FIG. 8, and the magnitude of the curvature of these fitted lines represents how far away from the correct value of the time constant $\tau$ are the assumed constants $\tau_{a_1}$, $\tau_{a_2}$. Whilst the dose controller 48 may solve this problem iteratively, i.e. by repeatedly fitting the data with different values for the assumed time constant $\tau_a$ to minimise the curvature until the best value is found, it is quicker to implement the dose controller 48 to find the correct time constant $\tau$ in one pass.

This is shown at 124 where the plots are fitted according to the relationships $$\ln I_{01} = a_1 n^2 + b_1 n + c_1 \qquad (6a)$$

and $$\ln I_{02} = a_2 n^2 + b_2 n + c_2 \qquad (6b)$$

to find the pass-corrected time constant $\tau_{pc}$. These equations are of the form y=ax²+bx+c and so share the inherent properties of this type of equation. For example, the location of the maxima or minima $y_m$ along the x axis are given by $$x_{(y_m)} = \frac{-b}{2a}$$

and the magnitude of this maxima or minima is given by $$y_m = -\frac{b^2}{4a} + c.$$

Hence, fitting equations (6a) and (6b) above produces four coefficients that are used to calculate the pass-corrected time constant $\tau_{pc}$ as follows $$A = \frac{\left(\frac{-b_1^2}{4a_1}\right) - \left(\frac{-b_2^2}{4a_2}\right)}{\tau_{a_1} - \tau_{a_2}} \quad B = \frac{-b_1^2}{4a_1} - A\tau_{a_1} \quad \tau_{pc} = -\frac{B}{A}$$

Mathematically, this is the equivalent to the operation described with respect to FIG. 4 and FIG. 5b, as is shown for this case by FIG. 7b. FIG. 7b shows two lines, one line to represent the time constant determination from step 102 and one for step 106. As can be seen, the lines do not cross the x-axis at the same position and so step 106 provides a more accurate determination of the true time constant $\tau$. Hence, an pass-corrected time constant $\tau_{pc}$ is found that can be used in the subsequent implant.

As will be appreciated by those skilled in the art, variations can be made to the above embodiments without departing from the scope of the invention.

For instance, the skilled person will appreciate that the idea of using a quadrature fitting of true beam current $I_0$ estimates determined for a series of scan lines $52_n$ spaced across the wafer 36 does not require those estimates to be found in exactly the way described above. In fact, any method of estimating the true beam current $I_0$ using the pump down time constant $\tau$ may benefit by being improved using the method described with reference to FIG. 6. For example, the time constant $\tau$ may be determined by taking pressure measurements during the separating periods like the method described in U.S. Pat. No. 4,234,797.

The embodiment described above initially uses an assumed time constant $\tau_a$ that is improved part-way through an implant by measuring directly the true beam current $I_0$ and that improves once more the time constant $\tau$ at the end of a pass using quadrature fitting. Of course, improving the time constant $\tau_a$ part-way through an implant may be omitted without departing from the scope of the claims.

How frequently the time constant $\tau$ is improved using quadrature fitting is a matter of choice. The above embodiment optimally performs a fit at the end of every pass, but this need not be the case. For example, where the time constant $\tau$ is known to vary only slowly, say by only 1% over the course of fifty passes, quadrature fitting need only be performed intermittently to ensure the time constant $\tau$ being used has not drifted too far away from the actual value. Likewise, the regularity with which the true beam current $I_0$ is determined may be varied from the example given above of a determination every odd scan line $52_1, 52_3, \ldots$ (and, of course, every even scan line may well be equally suitable).

Clearly, the dimension of the wafer 36 and the scanning arrangement (scan line spacing, ion beam size, etc.) provided above are intended to be nothing more than suitable examples and so may be freely varied as conditions require.

In addition, the numbers of data samples used above are also merely offered by way of example. That is to say, any number of ionic beam current measurements may be taken at the end of each scan line that ensures a reasonable statistical set rather than the one hundred mentioned above. Similarly, using fifty sets of the true beam current $I_0$ measurement in the quadrature fitting is but an example. In addition, the samples used for the curve fitting can be freely chosen. For example, the samples may be equally spread across the entire raster scan 50 or they may be irregularly spaced across the raster scan 50. In addition, the samples need not occupy the entire scan 50 and instead a selection of ionic current measurements taken from a small range of scan lines $52_n$ within the pass can be used. For example, only scan lines corresponding to the first or second half of the pass may be used. In theory, smaller sets can be used although, obviously, the smaller the set, the worse the results are likely to be.

The above embodiment measures the ionic beam current when the ion beam 23 passes across an imaginary line 54 to the right hand side of the wafer 36. However, this need not be the case. An alternative scheme is shown in FIG. 9 where the ionic beam current is measured after a fixed time delay from when the ion beam 23 has left the wafer 36. Accordingly, measurements start once the ion beam 23 has crossed the curved line 54a of FIG. 9 that approximates roughly to a semi-circle. To measure the time delay is straightforward as the signal produced by the Faraday detector 40 will rise as the edge of the ion beam 23 goes beyond the wafer 36. Hence, the required time delay can be counted from this rise in signal. Alternatively, predetermined times for the measurements to start can be set in advance for each of the scan lines $52_n$ to ensure the pattern shown in FIG. 9 is achieved. In addition, if ionic beam current measurements were taken on both sides left and right of the wafer 36, a corresponding curved line 56a could be used to indicate where the measurements are taken.

Moreover, the square raster scan 50 shown in FIGS. 2 and 9 need not be used. An alternative scheme is shown in FIG. 10, where the length of each scan line $52_n$ is proportional to the width of the wafer 36 such that the ion beam 23 travels a common distance beyond the edge of the wafer 36 before turning around. Accordingly, the scan line $52_n$ gets longer as the ion beam 23 approaches the centre of the wafer 36 and then shortens as the ion beam 23 continues towards the far edge of the wafer 36. In this arrangement, the ionic beam current measurements are taken a set time after the ion beam 23 has moved beyond the edge of the wafer 36, as indicated by the line 54b in FIG. 10, and as described above.

Whilst the above has been described in the context of serial processing of wafers, the invention may be applied to batch processing of wafers. A typical batch substrate holder comprises a spoked wheel, the end of each spoke bearing a wafer. The wheel is rotated so that the ion beam traces arcuate scan lines across each wafer: the substrate holder is translated relative to the ion beam to implant the entire water in a series of spaced, arcuate scan lines.

In theory, the separating periods may correspond to the times when the ion beam is in transit between adjacent wafers. However, the speed of rotation of the wheel would need to be slowed relative to usual operation to allow sufficient ionic current measurements to be taken during such separating periods. The wheel may also be stopped at an appropriate time to allow direct measurement of the true beam current akin to the embodiment described above. Thus, true beam current estimates may be made between each wafer. Moreover, a quadrature fitting may be performed at regular intervals, for example during the relatively long periods when the direction of translation of the substrate holder is being reversed.

The first aspect of the present invention may be used even when rotation of the wheel is performed at its usual speed. Even though there is not sufficient time to measure the ionic beam current between wafers, measurements may be taken when the direction of translation of the substrate holder is reversed (i.e. between successive passes). These measurements may yield the true beam current $I_0$, and this value may be used to correct the rotational speed of the wheel for one or more subsequent passes to ensure the desired dosing.

What is claimed is:

1. An ion implanter comprising:
   a vacuum chamber;
   a substrate holder in the vacuum chamber operative to support a target substrate;
   an ion beam generator operative to generate a beam of ions including a species to be implanted in the target substrate;
   a scanning apparatus operative to effect a relative scanning movement between the target substrate and the ion beam;
   a vacuum pump operative during implantation to pump residual gas from the vacuum chamber;
   the scanning apparatus being arranged to produce during an implant repeated scans of the beam over the target substrate separated by periods when the beam does not impinge on the target substrate, whereby residual gas pressure in said chamber rises during each of said scans due to outgassing from the target substrate and falls exponentially with a pump down time constant towards a minimum pressure value during said separating periods due to pumping by said vacuum pump, at least some of said separating periods having insufficient duration relative to said pump down constant to allow the residual gas pressure to reach said minimum pressure value;
   an ion current detector operative to provide multiple time spaced measurements of the ionic current in the ion beam at the target substrate during each of a plurality of said separating periods including said periods having insufficient duration;
   a controller operative to control said scanning apparatus to produce said repeated scans and being operative to provide at least one extended said separating period which has sufficient duration to allow the residual gas pressure to be pumped down to said minimum pressure value, said ion current detector providing said multiple time spaced measurements during said extended separating period; and
   a processor operative
   (a) to receive said multiple measurements from each of said separating periods including said extended separating period,
   (b) to identify from said ionic current measurements during said extended separating period, a maximum measured beam current value corresponding to the residual gas pressure reaching said minimum pressure value,
   (c) to calculate from the multiple time spaced measurements received during said extended separating period and said identified maximum measured beam current value, an estimate of said pump down time constant, and
   (d) to calculate from said received measurements during each of said plurality of separating periods subsequent to said extended operating period and said estimate of said pump down time constant, repetitive corrected values for the total beam current representing the rate of delivery in the beam of particles of the species to be implanted.

2. An ion implanter according to claim 1, wherein the processor is operative to estimate the pump down time constant using a linear regression.

3. An ion implanter according to claim 2, wherein the processor is operative to estimate the pump down time constant using at least two true beam currents determined from the measurements received during the extended separating period and at least two predetermined time constants.

4. An ion implanter according to claim 1, wherein the processor is operative initially to calculate from said received measurements during each of a first number of said plurality of separating periods prior to said extended separating period and a predetermined estimate value of said pump down time constant, first repetitive corrected values for total beam current representing the rate of delivery in the beam of particles of the species to be implanted.

5. An ion implanter according to claim 4, wherein the processor is operative to perform step (b) during a separating period substantially corresponding to when a rise in the residual gas pressure in the chamber due to outgassing first occurs.

6. An ion implanter according to claim 1, for implanting a target substrate comprising a circular wafer having a predetermined diameter;
   wherein said ion beam generator is operative to generate a beam having orthogonal cross-sectional dimensions which are less than said diameter and the scanning apparatus is operative to scan the beam in multiple spaced lines over the wafer to form a raster, with said separating periods between said scan lines; and
   wherein said processor is operative at a selected time:
   to store ionic current measurements received during separating periods at the end of selected said scan lines distributed over the wafer area;
   to calculate using an estimate of said pump down time constant, a corrected total beam current value from the received measurements following each of said selected scan lines to provide an array of corrected total beam current values against the positions of the respective scan lines across the wafer in the scan line spacing direction;
   to detect from said array, a predetermined quadrature variation of said calculated, corrected total beam current values with position across the wafer; and
   to calculate a further improved estimate of said pump down constant which substantially eliminates said quadrature variation when used to calculate said corrected total beam current values of the array.

7. An ion implanter according to claim 6, wherein the selected time is at the end of a pass.

8. An ion implanter according to claim 7, wherein the controller is operative to produce an extended separating period only in a first implant and wherein the processor is operative in successive implants to calculate from said received measurements during each of said plurality of separating periods of said successive implants and said improved estimate of said pump down time constant, a corrected value for total beam current representing the rate of delivery in the beam of particles of the species to be implanted.

9. An ion implanter comprising:
   a vacuum chamber;

a substrate holder in the vacuum chamber operative to support a target substrate comprising a circular wafer having a predetermined diameter;

an ion beam generator operative to generate a beam of ions including a species to be implanted in the target substrate;

a scanning apparatus operative to effect a relative scanning movement between the target substrate and the ion beam;

a vacuum pump operative during implantation to pump residual gas from the vacuum chamber;

the scanning apparatus being arranged to produce during an implant repeated scans of the beam over the target substrate separated by periods when the beam does not impinge on the target substrate, whereby residual gas pressure in said chamber rises during each of said scans due to outgassing from the target substrate and falls exponentially with a pump down time constant towards a minimum pressure value during said separating periods due to pumping by said vacuum pump, at least some of said separating periods having insufficient duration relative to said pump down constant to allow the residual gas pressure to reach said minimum pressure value;

an ion current detector operative to provide multiple time spaced measurements of the ionic current in the ion beam at the target substrate during each of a plurality of said separating periods including said periods having insufficient duration;

a processor operative
to receive said multiple measurements,
to generate an estimate of said pump down time constant, and
to calculate from said received measurements during each of said plurality of separating periods and said estimate of said pump down time constant, a corrected value for total beam current representing the rate of delivery in the beam of particles of the species to be implanted;

wherein:

said ion beam generator being operative to generate a beam having orthogonal cross-sectional dimensions which are less than said diameter and the scanning apparatus is operative to scan the beam in multiple spaced lines over the wafer to form a raster, with said separating periods between said scan lines; and wherein said processor is operative:
to store ionic current measurements received during separating periods at the end of selected said scan lines distributed over the wafer area;
to calculate using an estimate of said pump down time constant, a corrected total beam current value from the received measurements following each of said selected scan lines to provide an array of corrected total beam current values against the positions of the respective scan lines across the wafer in the scan line spacing direction;
to detect from said array, a predetermined quadrature variation of said calculated, corrected total beam current values with position across the wafer; and
to calculate an improved estimate of said pump down constant which substantially eliminates said quadrature variation when used to calculate said corrected total beam current values of the array.

10. An ion implanter according to claim 9, wherein the processor is operative to eliminate the quadrature variation by optimising the pump down time constant iteratively.

11. An ion implanter according to claim 9, wherein the processor is operative to determine the curvature of the quadrature variation and is operative to use the curvature to calculate the improved time constant.

12. A method of implanting ions in a target substrate using an ion implanter comprising a vacuum chamber, a substrate holder in the vacuum chamber operative to support the target substrate, an ion beam generator, a scanning apparatus, a vacuum pump, an ion current detector, a controller and a processor;

the method comprising the steps of:
generating a beam of ions with the ion beam generator including a species to be implanted in the target substrate;

operating the controller to control said scanning apparatus to effect a relative scanning movement between the target substrate and the ion beam;

pumping the vacuum chamber with the vacuum pump during implantation to pump residual gas from the vacuum chamber;

whereby the scanning apparatus is operated to produce during an implant repeated scans of the beam over the target substrate separated by periods when the beam does not impinge on the target substrate, whereby residual gas pressure in said chamber rises during each of said scans due to outgassing from the target substrate and falls exponentially with a pump down time constant towards a minimum pressure value during said separating periods due to pumping by said vacuum pump, at least some of said separating periods having insufficient duration relative to said pump down constant to allow the residual gas pressure to reach said minimum pressure value;

measuring the ionic current with the ion current detector to provide multiple time spaced measurements of the ionic current in the ion beam at the target substrate during each of a plurality of said separating periods including said periods having insufficient duration;

operating the controller to control said scanning apparatus to provide at least one extended said separating period which has sufficient duration to allow the residual gas pressure to be pumped down to said minimum pressure value, and operating said ion current detector to provide said multiple time spaced measurements during said extended separating period; and passing said multiple measurements from each of said separating periods including said extended separating period to the processor, identifying from said ionic current measurements during said extended separating period, using the processor, a maximum measured beam current value corresponding to the residual gas pressure reaching said minimum pressure value, calculating from the multiple time spaced measurements received during said extended separating period and said identified maximum measured beam current value, using the processor, an estimate of said pump down time constant, and calculating from said received measurements during each of said plurality of separating periods and said estimate of said pump down time constant, using the processor, a corrected value for the total beam current representing the rate of delivery in the beam of particles of the species to be implanted.

13. A method according to claim 12, wherein the processor estimates the pump down time constant using a linear regression.

14. A method according to claim 13, wherein the processor estimates the pump down time constant using at least two true beam currents determined from the measurements received during the extended separating period and at least two predetermined time constants.

15. A method according to claim 12, wherein the processor is operated:
   (a) initially to calculate from said received measurements during each of said plurality of separating periods and a predetermined estimate of said pump down time constant, a corrected value for total beam current representing the rate of delivery in the beam of particles of the species to be implanted;
   (b) subsequently to identify from said ionic current measurements during said extended separating period, a maximum measured beam current value corresponding to the residual gas pressure reaching said minimum pressure value, to calculate from the multiple time spaced measurements received during said extended separating period and said identified maximum measured beam current value, an estimate of said pump down time constant; and
   (c) thereafter to calculate from said received measurements during each of said plurality of separating periods and said estimated pump down time constant, a corrected value for total beam current representing the rate of delivery in the beam of particles of the species to be implanted.

16. A method according to claim 15, wherein the processor performs step (b) during a separating period substantially corresponding to when a rise in the residual gas pressure in the chamber due to outgassing first occurs.

17. A method according to claim 12 of implanting a target substrate comprising a circular wafer having a predetermined diameter;
   wherein said ion beam generator generates a beam having orthogonal cross-sectional dimensions which are less than said diameter and the scanning apparatus is operative to scan the beam in multiple spaced lines over the wafer to form a raster, with said separating periods between said scan lines; and
   wherein said processor is operated at a selected time:
      to store ionic current measurements received during separating periods at the end of selected said scan lines distributed over the wafer area;
      to calculate using an estimate of said pump down time constant, a corrected total beam current value from the received measurements following each of said selected scan lines to provide an array of corrected total beam current values against the positions of the respective scan lines across the wafer in the scan line spacing direction;
      to detect from said array, a predetermined quadrature variation of said calculated, corrected total beam current values with position across the wafer; and
      to calculate a further improved estimate of said pump down constant which substantially eliminates said quadrature variation when used to calculate said corrected total beam current values of the array.

18. A method according to claim 17, wherein the selected time is at the end of a pass.

19. A method according to claim 18, wherein the controller produces an extended separating period only in a first implant and wherein the processor is operated in successive implants to calculate from said received measurements during each of said plurality of separating periods of said successive implants and said improved estimate of said pump down time constant, a corrected value for total beam current representing the rate of delivery in the beam of particles of the species to be implanted.

20. A method of implanting ions in a target substrate using an ion implanter comprising a vacuum chamber, a substrate holder in the vacuum chamber operative to support a target substrate comprising a circular wafer having a predetermined diameter; an ion beam generator, a scanning apparatus, a vacuum pump, an ion current detector, and a processor;
   the method comprising the steps of:
   generating an ion beam using the ion beam generator including a species to be implanted in the target substrate;
   pumping the vacuum chamber with the vacuum pump during implantation to pump residual gas from the vacuum chamber;
   operating the scanning apparatus to effect a relative scanning movement between the target substrate and the ion beam to produce, during an implant, repeated scans of the beam over the target substrate separated by periods when the beam does not impinge on the target substrate;
   whereby residual gas pressure in said chamber rises during each of said scans due to outgassing from the target substrate and falls exponentially with a pump down time constant towards a minimum pressure value during said separating periods due to pumping by said vacuum pump,
   at least some of said separating periods having insufficient duration relative to said pump down constant to allow the residual gas pressure to reach said minimum pressure value;
   measuring an ionic current using the ion current detector to provide multiple time spaced measurements of the ionic current in the ion beam at the target substrate during each of a plurality of said separating periods including said periods having insufficient duration;
   passing said multiple measurements to the processor, generating an estimate of said pump down time constant using the processor, and
   calculating from said received measurements during each of said plurality of separating periods and said estimate of said pump down time constant, using the processor, a corrected value for total beam current representing the rate of delivery in the beam of particles of the species to be implanted;
   wherein:
   said ion beam generator is operated to generate a beam having orthogonal cross-sectional dimensions which are less than said diameter and the scanning apparatus is operative to scan the beam in multiple spaced lines over the wafer to form a raster, with said separating periods between said scan lines; and
   wherein said processor is operated:
      to store ionic current measurements received during separating periods at the end of selected said scan lines distributed over the wafer area;
      to calculate using an estimate of said pump down time constant, a corrected total beam current value from the received measurements following each of said selected scan lines to provide an array of corrected total beam current values against the positions of the respective scan lines across the wafer in the scan line spacing direction;
      to detect from said array, a predetermined quadrature variation of said calculated, corrected total beam current values with position across the wafer; and
      to calculate an improved estimate of said pump down constant which substantially eliminates said quadrature variation when used to calculate said corrected total beam current values of the array.

21. A method according to claim 20, wherein the processor eliminates the quadrature variation by optimising the pump down time constant iteratively.

22. A method according to claim 20, wherein the processor determines the curvature of the quadrature variation and uses the curvature to calculate the improved time constant.

* * * * *